US012608059B2

(12) United States Patent
Navarro Alvarez et al.

(10) Patent No.: US 12,608,059 B2
(45) Date of Patent: Apr. 21, 2026

(54) LIQUID COOLING SYSTEMS AND COOLERS FOR ELECTRONIC DEVICES

(71) Applicant: Intel Corporation, Santa Clara, CA (US)

(72) Inventors: Arturo Navarro Alvarez, Belen (CR); Jose Diaz Marin, San Jose (CR); Mark MacDonald, Beaverton, OR (US); Akhilesh Rallabandi, Chandler, AZ (US); Jose Salazar Delgado, San Jose (CR)

(73) Assignee: Intel Corporation, Santa Clara, CA (US)

( * ) Notice: Subject to any disclaimer, the term of this patent is extended or adjusted under 35 U.S.C. 154(b) by 889 days.

(21) Appl. No.: 17/697,631

(22) Filed: Mar. 17, 2022

(65) Prior Publication Data

US 2022/0214730 A1      Jul. 7, 2022

(51) Int. Cl.
G06F 1/20          (2006.01)
H05K 7/20          (2006.01)

(52) U.S. Cl.
CPC ......... *G06F 1/206* (2013.01); *H05K 7/20263* (2013.01); *H05K 7/20272* (2013.01); *H05K 7/20281* (2013.01); *H05K 7/20409* (2013.01); *H05K 7/20509* (2013.01); *G06F 2200/201* (2013.01)

(58) Field of Classification Search
CPC ...... G06F 1/20; G06F 1/206; G06F 2200/201; G06F 1/203; H01L 23/38; H01L 23/473; H05K 7/20263; H05K 7/20272; H05K 7/20281; H05K 7/20409; H05K 7/20509; F25B 21/02
USPC ......................................... 700/300
See application file for complete search history.

(56) References Cited

U.S. PATENT DOCUMENTS

| 6,880,346 | B1 * | 4/2005 | Tseng | ..................... | H10N 10/13 |
| | | | | | 257/E23.099 |
| 7,866,164 | B2 * | 1/2011 | Rice | ................... | B60H 1/00478 |
| | | | | | 62/259.3 |
| 2006/0278372 | A1 * | 12/2006 | Lai | ......................... | H01L 23/467 |
| | | | | | 165/80.4 |
| 2007/0034356 | A1 * | 2/2007 | Kenny | .................... | F04B 17/00 |
| | | | | | 257/E23.098 |
| 2007/0074853 | A1 * | 4/2007 | Popovich | ........... | H05K 7/20245 |
| | | | | | 165/80.4 |
| 2013/0199208 | A1 * | 8/2013 | Shi | .......................... | F25B 21/02 |
| | | | | | 62/3.2 |
| 2018/0004259 | A1 * | 1/2018 | Kulkarni | ................. | F25B 21/02 |
| 2020/0363104 | A1 | 11/2020 | MacDonald et al. | | |

* cited by examiner

*Primary Examiner* — Chun Cao
(74) *Attorney, Agent, or Firm* — Hanley, Flight & Zimmerman, LLC

(57) ABSTRACT
Liquid cooling systems and coolers for electronic devices are disclosed herein. An example cooler includes a first thermal block having a first fluid passageway, a second thermal block having a second fluid passageway, and a thermoelectric cooler (TEC) coupled between the first thermal block and the second thermal block. The second thermal block is to be disposed on a processor of an electronic device such that the second thermal block is disposed between the TEC and the processor.

19 Claims, 9 Drawing Sheets

100

104

106

102

108

110

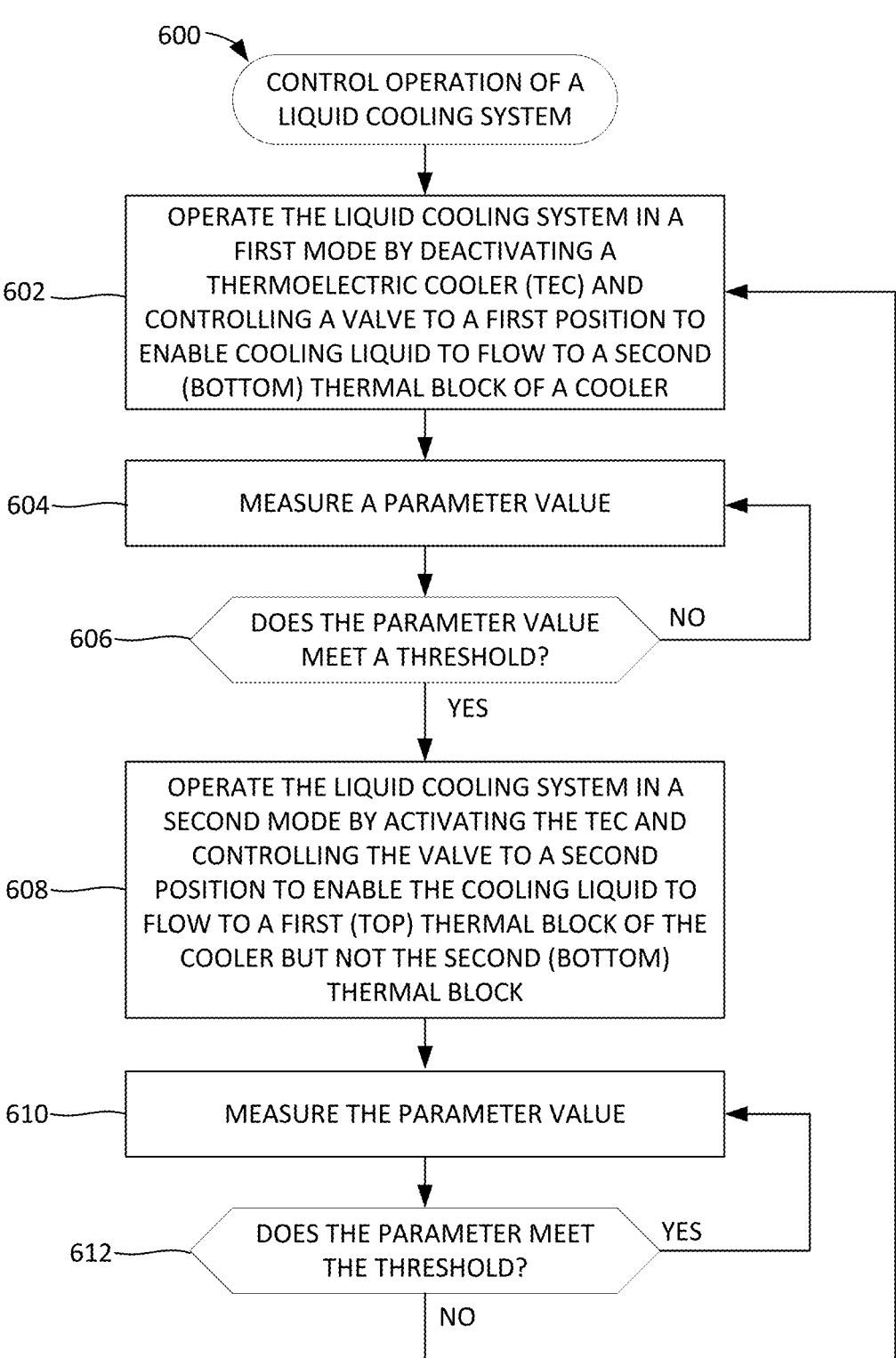

600 —

CONTROL OPERATION OF A
LIQUID COOLING SYSTEM

602 —— OPERATE THE LIQUID COOLING SYSTEM IN A
FIRST MODE BY DEACTIVATING A
THERMOELECTRIC COOLER (TEC) AND
CONTROLLING A VALVE TO A FIRST POSITION TO
ENABLE COOLING LIQUID TO FLOW TO A SECOND
(BOTTOM) THERMAL BLOCK OF A COOLER

604 —— MEASURE A PARAMETER VALUE

606 —— DOES THE PARAMETER VALUE
MEET A THRESHOLD?     NO

YES

608 —— OPERATE THE LIQUID COOLING SYSTEM IN A
SECOND MODE BY ACTIVATING THE TEC AND
CONTROLLING THE VALVE TO A SECOND
POSITION TO ENABLE THE COOLING LIQUID TO
FLOW TO A FIRST (TOP) THERMAL BLOCK OF THE
COOLER BUT NOT THE SECOND (BOTTOM)
THERMAL BLOCK

610 —— MEASURE THE PARAMETER VALUE

612 —— DOES THE PARAMETER MEET
THE THRESHOLD?     YES

LIQUID COOLING SYSTEMS AND COOLERS FOR ELECTRONIC DEVICES

FIELD OF THE DISCLOSURE

This disclosure relates generally to cooling systems and, more particularly, to liquid cooling systems and coolers for electronic devices.

BACKGROUND

Liquid cooling systems are commonly used in computing devices to reduce heat generated by the electronic components. For instance, computers often include cooling systems to reduce the heat generated by the central processing unit (CPU).

BRIEF DESCRIPTION OF THE DRAWINGS

FIG. 6 is a flowchart representative of example machine readable instructions and/or example operations that may be executed by example processor circuitry to implement an example controller of the example cooling system of FIG. 2.

Figure 1:
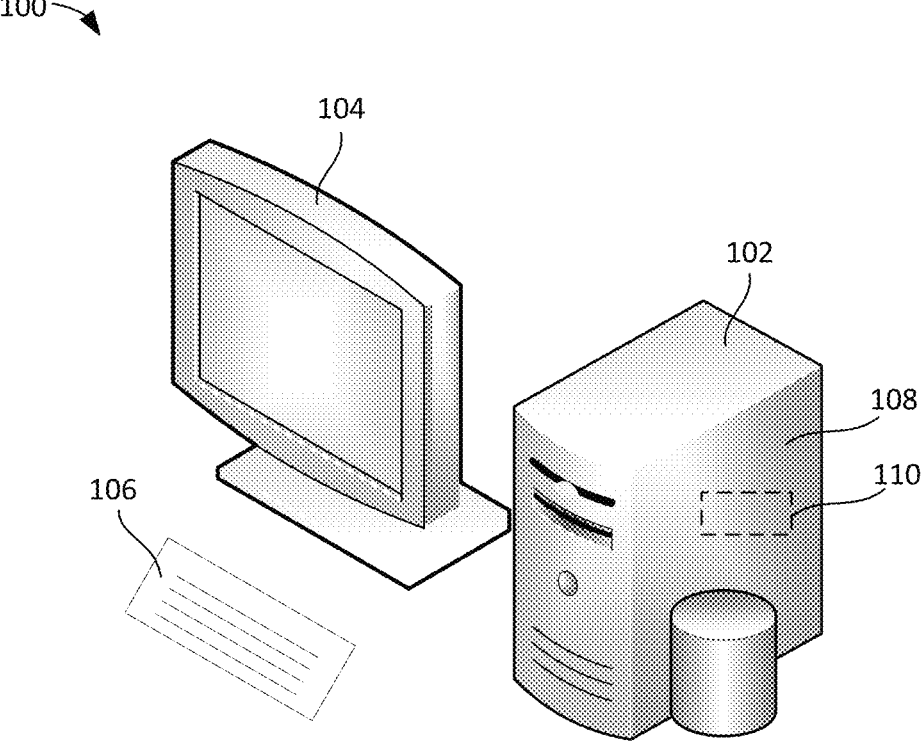
FIG. 1 illustrates an example electronic device in which the examples disclosed herein can be implemented.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

DETAILED DESCRIPTION

Electronic devices, such as computers, laptops, servers, etc. often include electrical components that generate heat. For example, processors, hard drives, batteries, and other electrical components generate heat during operation. Heat can negatively affect the performance of an electrical component as well as other nearby components and, thus, negatively impact the performance of the electronic device.

Therefore, electronic devices often include a cooling system, such as a liquid cooling system. A liquid cooling system includes a cooler (which may also be referred to as a cooling block or water block) that is disposed on or near an electrical component, such as a central processing unit (CPU). The liquid cooling system includes a pump that pumps cooling liquid, such as water, through the cooler. The cooling liquid absorbs heat from the CPU, thereby reducing the temperature of the CPU and/or keeping the CPU closer to ambient temperature. The liquid cooling system pumps the heated cooling liquid through a radiator. In some examples, one or more fans are mounted near the radiator that force air across the radiator to reduce the temperature of the cooling liquid. The cooling liquid is then pumped back to the cooler and the cycle is repeated. The amount of heat that can be removed from the CPU and expelled to the ambient air typically depends on the flow (pump performance), the exchange area of the cooler, and the radiator efficiency.

Some example liquid cooling systems include a thermoelectric cooler (TEC) in the cooler. The TEC is a thermoelectric device, sometimes referred to as a Peltier device, Peltier heat pump, or a solid state refrigerator. The TEC can produce sub-ambient temperatures, which enables the liquid cooling system to significantly reduce the temperature of the CPU. This type of cooling systems is sometimes referred to as a cryo-cooler. The TEC has a hot side and a cold side. When a voltage is applied to the TEC, heat is transferred from the cold side to the hot side, such that the cold side reaches sub-ambient temperatures, and the hot side reaches above-ambient temperatures. The TEC is arranged such that the cold side is on or facing the CPU, and a thermal block (sometimes referred to as water block) is disposed on the hot side. The thermal block has a fluid passageway, which enables the cooling liquid to be pumped through the thermal block to absorb the heat output by the hot side of the TEC and/or the CPU. When CPU power is increased (e.g., when demand is high), the TEC can be activated to reduce the temperature of the CPU, thereby enabling the CPU to operate more efficiently. However, the TEC requires relatively high power consumption. Therefore, when CPU power usage is not high, the TEC can be deactivated to conserve energy. When the TEC is turned off, the liquid cooling system continues to pump liquid through the thermal block. However, the TEC is disposed between the CPU and the thermal block, which degrades the thermal heat transfer capacity of the cooler. To compensate for this degradation in the thermal solution performance, the fan runs at higher (e.g., maximum) speeds, which generates an undesirable amount of noise and results in an unsatisfactory experience for the user (e.g., a person using the electronic device).

Disclosed herein are example coolers and example liquid cooling systems with such example coolers that improve the cooling capacity of the cooler when the TEC is deactivated. Example coolers disclosed herein include a bottom thermal block that is disposed between the TEC and the CPU. Therefore, the TEC is disposed between (e.g., sandwiched between) a first (top) thermal block and a second (bottom) thermal block. The first thermal block has a first fluid passageway and the second thermal block has a second fluid passageway. When the TEC is deactivated, cooling liquid is pumped through the second thermal block, which is closer to the CPU than the first thermal block and, thus, can more effectively absorb the heat from the CPU. This greatly improves CPU performance when the TEC is deactivated or in a standby mode. When the TEC is activated, liquid is pumped through the first (top) thermal block, but not the second (bottom) thermal block. This prevents or reduces the possibility of the liquid in the second fluid passageway from removing cooling energy that could otherwise be used to cool the CPU. In some examples, the liquid cooling system includes a valve that operates to switch between directing the liquid through the second thermal block (when the TEC is not activated) or directing the liquid through the first thermal block (when the TEC is activated). The example liquid cooling system can include a controller to switch the liquid cooling system back-and-forth between these two modes. Therefore, the example systems disclosed herein can achieve better cooling in the first mode when the TEC is deactivated compared to known systems. This enables higher CPU powers without having to activate the TEC, which results in power savings, and added performance. This also reduces the amount of time the fan is activated and/or enables the fan to be activated at a lower fan speeds, which reduces overall noise of the system.

Now turning to the figures, FIG. 1 illustrates an example electronic device 100 in which the example apparatus, systems, methods, and articles of manufacture disclosed herein can be implemented. The example electronic device 100 may also be referred to as a computing device. In FIG. 1, the electronic device 100 is implemented as a desktop computer that includes a computer 102, a display 104, and a keyboard 106. The computer 102, the display 104, and/or the keyboard 106 can be separate devices or integrated into a combined device (e.g., the computer 102 may be built into the enclosure of the display 104). The computer 102 includes an enclosure 108 and one or more heat generating devices 110 carried by (e.g., disposed within) the enclosure 108. The one or more heat generating devices 110 can include, for example, one or more processors (e.g., a central processing unit (CPU), a graphics processing unit (GPU), a microprocessor, etc.), one or more storage devices (e.g., a hard drive), and/or other circuitry. Disclosed herein are example cooling systems that can be used in connection with the computer 102 to reduce the heat generated by the heat generating devices 110, which enables the heat generating devices 110 to operate more efficiently. An example cooling system can be at least partially disposed within the enclosure 108 of the computer 102. While in this example the electronic device 100 is shown as a desktop computer, in other examples, the electronic device 100 can be implemented by any other kind of electronic device, computing system, or system of devices, such as a laptop computer, a tablet computer, a multimedia player, a server, a smart phone, etc. Thus, the example cooling systems disclosed herein can be implemented in connection with any type of electronic device or system of devices.

Figure 2:
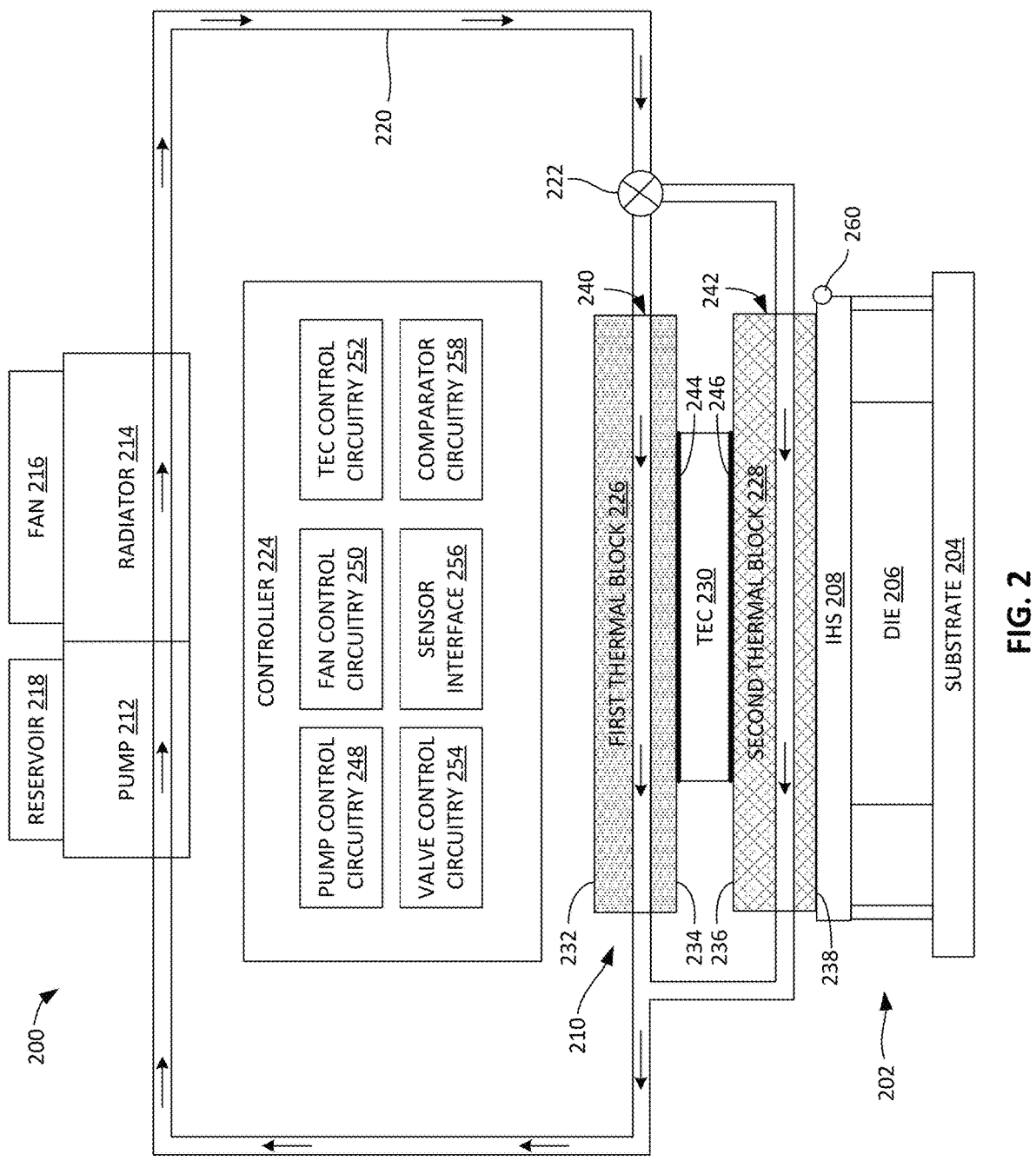
FIG. 2 is a schematic diagram of an example liquid cooling system including an example cooler that can be implemented in the example electronic device of FIG. 1.

FIG. 2 is a schematic of an example liquid cooling system 200 constructed in accordance with the teachings of this disclosure. The example liquid cooling system 200 can be used in connection with the electronic device 100 of FIG. 1. For example, the example liquid cooling system 200 can be at least partially disposed in the enclosure 108 (FIG. 1). The example liquid cooling system 200 can be used to reduce the heat generated by one or more of the heat generating devices 110 (FIG. 1). For example, FIG. 2 shows an example central processing unit (CPU) 202 of the computer 102. The CPU 202 may also be referred to as a processor. The CPU 202 generates heat when operating. It is generally known that heat tends to degrade the efficiency of computing circuitry. In particular, heat can lower the electrical resistance of objects, therefore increasing the current in those objects. The example liquid cooling system 200 can be used to reduce the heat and thereby improve performance of the CPU 202.

In the illustrated example, the CPU 202 includes a substrate 204 (e.g., a silicone substrate, a motherboard), a die 206 (e.g., circuitry) on the substrate 204, and an integrated heat spreader (IHS) 208 over the die 206. The CPU 202 can include any number of dies and/or other types of circuitry. The IHS 208 helps dissipate heat generated by the die 206 and/or other circuitry of the CPU 202. In other examples, the CPU 202 may not include an IHS.

In the illustrated example, the example liquid cooling system 200 includes an example cooler 210, an example pump 212, an example radiator 214, an example fan 216, and an example reservoir 218. The example cooler may also be referred to as a cooling block or water block. The example liquid cooling system 200 also includes a fluid circuit 220 that fluidly couples the cooler 210, the pump 212, and the radiator 214. The fluid circuit 220 can include any type and/or number of fluid lines (e.g., hoses, tubes), fluid channels, connectors, valves, and/or a system of the foregoing that fluidly couple the components. The fluid circuit 220 has cooling liquid, such as water. In other examples, the cooling liquid can be another type of liquid, such as deionized water, a glycol/water solution, and/or a dielectric fluid.

In the illustrated example, the cooler 210 absorbs heat from the CPU 202, which is then transferred by the cooling liquid in the fluid circuit 220 to the radiator 214. In the illustrated example, the cooler 210 is on (e.g., disposed on) the CPU 202. In particular, in this example, the cooler 210 is on the IHS 208 of the CPU 202. In some examples, the cooler 210 is in direct contact with the IHS 208. In other examples, one or more intermediary components or layers can be disposed between the cooler 210 and the IHS 208 and/or the cooler 210 can be disposed close to but spaced apart from the CPU 202. In some examples, the cooler 210 is coupled to the CPU 202. For example, the cooler 210 can be coupled to the IHS 208 via one or more threaded fasteners (e.g., bolts, screws, etc.), welding, soldering, adhesives, etc.

When the liquid cooling system 200 is activated, the pump 212 pumps the cooling liquid through the fluid circuit 220. The cooling liquid flows through one or more passageways in the cooler 210 (disclosed in further detail herein) where the cooling liquid absorbs heat from the CPU 202, thereby reducing the temperature of the CPU 202. The heated cooling liquid is pumped through the radiator 214. The radiator 214 dissipates the heat to the surrounding ambient air. In some examples, the fan 216 can be activated to direct ambient air across the radiator 214 to help further reduce the temperature of the cooling liquid. In some examples, the fan 216 is positioned in the enclosure 108 (FIG. 1) to eject the hot air outward from the enclosure 108. The cooling liquid, after being cooled in the radiator 214, is pumped back to the cooler 210 and the cycle is repeated. The fluid circuit 220 includes a continuous flow of cooling liquid. In some examples, the reservoir 218 contains additional cooling liquid to ensure a sufficient amount of cooling liquid is maintained in the fluid circuit 220. In the illustrated example, the liquid cooling system 200 includes a valve 222 coupled to and/or otherwise disposed in the fluid circuit 220 upstream of the cooler 210.

In the illustrated example, the liquid cooling system 200 includes a controller 224, which controls operations of the electrical components of the liquid cooling system 200. The controller 224 can be implemented by processor circuitry. In some examples, the controller 224 is a separate component apart from the CPU 202. In other examples, the controller 224 or one or more operations of the controller 224 can be implemented or incorporated into the CPU 202 or another computing device of the electronic device 100 (FIG. 1).

In the illustrated example, the cooler 210 includes a first thermal block 226, a second thermal block 228, and a thermoelectric cooler (TEC) 230 between the first and second thermal blocks 226, 228. The first and second thermal blocks 226, 228 can be constructed of any thermally conductive material, such as a metal. In some examples, the first and second thermal blocks 226, 228 are copper blocks. In other examples, the first and/or second thermal blocks 226, 228 can be constructed of another material, such aluminum, brass, steel, etc. The first thermal block 226 has a first side 232 and a second side 234 opposite the first side 232. The second thermal block 228 has a first side 236 and a second side 238 opposite the first side 236.

In the illustrated example, the first thermal block 226 has a first fluid passageway 240 (which may also be referred to as a first fluid channel). In some examples, the first fluid passageway 240 is defined or formed in the first thermal block 226 (e.g., formed in the material of the first thermal block 226). In other examples, the first fluid passageway 240 may be a tube or hose extending through the first thermal block 226. In the illustrated example, the second thermal block 228 has a second fluid passageway 242 (which may also be referred to as a second fluid channel). In some examples, the second fluid passageway 242 is defined or formed in the second thermal block 228 (e.g., formed in the material of the second thermal block 228). In other examples, the second fluid passageway 242 may be a tube or hose extending through the second thermal block 228. The fluid circuit 220 is fluidly coupled to the first and second fluid passageways 240, 242. As such, when the pump 212 is activated, the cooling liquid can be directed through one or both of the first and second fluid passageways 240, 242 of the first and second thermal blocks 226, 228. The first and second thermal blocks 226, 228, which are thermally conductive, draw heat away from the CPU 202. The cooling liquid absorbs the heat and transfers the heat to the radiator 214, thereby reducing the temperature of the CPU 202.

The valve 222 controls which fluid passageway the cooling liquid is directed or routed through. The valve 222 is operable between a closed position and one or more open positions. In some examples, the valve 222 can be controlled to a first open position that only directs the cooling liquid to the first fluid passageway 240 but not the second fluid passageway 242. Conversely, the valve 222 can be controlled to a second open position that only directs the cooling liquid to the second fluid passageway 242 but not the first fluid passageway 240. In some examples, the valve 222 is also operable to a third open position in which the cooling liquid is directed to both the first and second fluid passageways 240. 242. When the valve 222 is closed, the cooling liquid is blocked from flowing to either or the first or second fluid passageways 240, 242.

The TEC 230 is a thermoelectric device that uses the Peltier effect. This type of device is also commonly referred to as a Peltier device, a Peltier heat pump, or a solid state refrigerator. Thermoelectric devices can also be used to generate electricity (and can be referred to as a thermoelectric generator). The TEC 230 has a first side 244, referred to herein as a hot side 244, and a second side 246, referred to herein as a cold side 246, opposite the hot side 244. When a voltage is applied to the TEC 230, the result of the Peltier effect brings heat from the cold side 246 to the hot side 244. As a result, the cold side 246 gets colder, such as reaching sub-ambient temperatures, while the hot side 244 gets hotter, such as reaching above-ambient temperatures. The controller 224 can activate or deactivate the TEC 230. In some examples, the controller 224 can control (e.g., increase or decrease) the amount of voltage applied to the TEC 230 to affect the temperature change of the TEC 230.

In the illustrated example, the TEC 230 is between (e.g., clamped between, coupled between, etc.) the first and second thermal blocks 226, 28. In particular, the hot side 244 of the TEC 230 is on the second side 234 of the first thermal block 226, and the cold side 246 of the TEC 230 is on the first side 236 of the second thermal block 228. In some examples, the hot side 244 is in contact with the first thermal block 226, and the cold side 246 is in contact with the second thermal block 228. In other examples, one or more intermediary structures may be disposed between the TEC 230 and the first and/or second thermal blocks 226, 228. In some examples, the TEC 230 is coupled to the first and second thermal blocks 226, 228, such as by using an adhesive, fasteners (e.g., bolts, screws, etc.). In other examples, the TEC 230 is not directly coupled to the first or second thermal blocks 226, 228 but is merely clamped between the first and second thermal blocks 226, 228.

Figure 3:
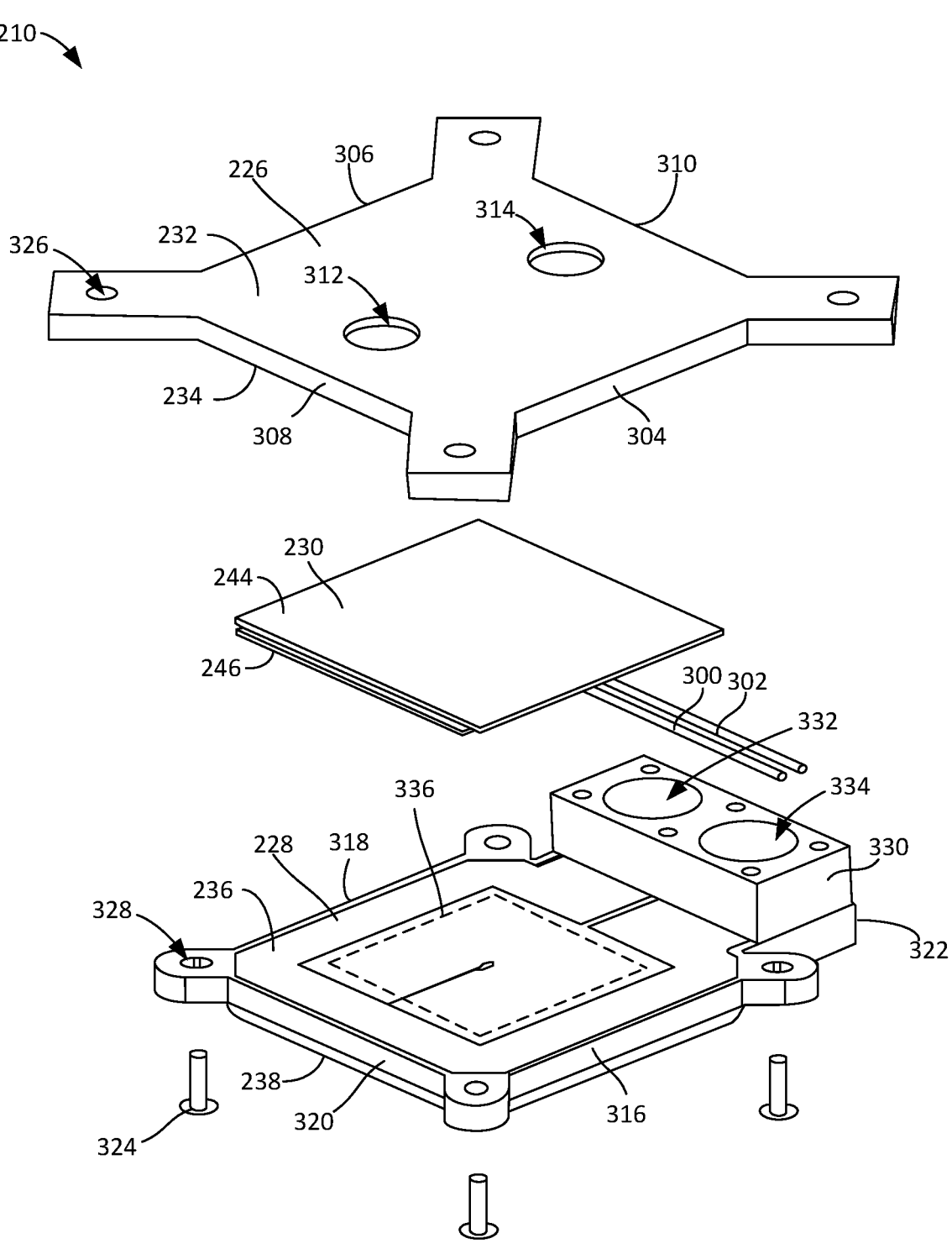
FIG. 3 is an exploded view of the example cooler of the example liquid cooling system of FIG. 2.

As shown in FIG. 2, the second thermal block 228 is between the TEC 230 and the CPU 202. In the illustrated example, the second thermal block 228 is on the CPU 202. In particular, the second side 238 of the second thermal block 228 is on the CPU 202. In some examples, the second side 238 of the second thermal block 228 is in direct contact with the CPU 202 (e.g., with the IHS 208). In other examples, one or more intermediary structures can be disposed between the second thermal block 228 and the CPU 202. In some examples, the second thermal block 228 is coupled to the CPU 202 (e.g., via one or more threaded fasteners as shown in FIG. 3, an adhesive, soldering, etc.). When the TEC 230 is activated, the cold side 246 of the TEC 230 draws heat away from the second thermal block 228, which reduces the temperature of the second thermal block 228 to sub-ambient temperatures. This significantly reduces the temperature of the CPU 202, sometimes referred to as cryo-cooling. The hot side 244 of the TEC 230 transfers heat to the first thermal block 226, which can be absorbed by the cooling liquid flowing through the first fluid passageway 240.

In some examples, the liquid cooling system 200 is operable in a first mode and a second mode. The modes may be based on the power usage and/or cooling demands of the CPU 202. The controller 224 may control the components of the liquid cooling system 200 to switch between the two modes. In the first mode, the TEC 230 is deactivated, the pump 212 is activated, and the valve 222 is in a position that directs the cooling liquid to the second fluid passageway 242 of the second thermal block 228. As such, the cooling liquid flowing through the second thermal block 228 absorbs the heat from the CPU 202 to reduce the temperature of the CPU 202. In some examples, in the first mode, the valve 222 only directs the cooling liquid through the second fluid passageway 242, but not the first fluid passageway 240 in the first thermal block 226. In other words, in some examples, the second thermal block 228 provides sufficient cooling, such that using the first thermal block 226 only provides small or marginal cooling difference. However, in other examples, in the first mode, the valve 222 may direct the cooling liquid through both the first fluid passageway 240 and the second fluid passageway 242.

In the second mode, the TEC 230 is activated, the pump 212 is activated, and the valve 222 is in a position that only directs fluid through the first fluid passageway 240 of the first thermal block 226 but not the second fluid passageway 242 of the second thermal block 228. Therefore, in the second mode, the valve 222 is in a position that ceases directing the cooling liquid through the second fluid passageway 242 of the second thermal block 228. In this second mode, the cold side 246 of the TEC 230 cools the second thermal block 228 to sub-ambient temperatures. This cools the CPU 202 and enables the CPU 202 to operate at higher frequencies to meet higher processing demands. This also enables the CPU 202 to operate at high powers before hitting a temperature limit in the CPU 202. The TEC 230 transfers any heat from the cold side 246 to the hot side 244, which increases the temperature of the first thermal block 226. The cooling liquid flowing though the first fluid passageway 240 absorbs the heat and transfers the heat to the radiator 214. In the second mode, the cooling liquid is not directed through the second fluid passageway 242. The cold side 246 of the TEC 230 can reach sub-ambient temperatures. Therefore, directing liquid through the second fluid passageway 242 could diminish the cooling capacity that could otherwise be used to cool the CPU 202.

In some examples, the liquid cooling system 200 switches between the first and second modes based one or more parameters. For example, the liquid cooling system 200 may operate in the first mode when the power usage of the CPU 202 is relatively low or when efficiency of the CPU 202 is not as important (e.g., when doing simple tasks on the electronic device 100 (FIG. 1)). The second thermal block 228 is closer to the CPU 202 than the first thermal block 226 and, thus, can cool the CPU 202 more efficiently when the TEC 230 is deactivated. This improves cooling and reduces the amount of time and/or speed the fan 216 is operating, which reduces audible noise. If there is a higher power usage or demand of the CPU 202 (e.g., during gaming or live streaming high graphic content), the liquid cooling system 200 can switch to the second mode, which can provide sub-ambient cooling to enable the CPU 202 to operate more efficiently during high processing demand times. In the second mode, the TEC 230 can produce sub-ambient temperatures, which helps keep the CPU 202 relatively cool, and which enables the CPU 202 to operate at higher frequencies. The liquid cooling system 200 can switch back-and-forth between the first and second modes as the CPU power increase and decrease. Therefore, the examples disclosed herein enable cryo-cooling at high power times, but can also still efficiently cool the CPU 202 when the TEC 230 is deactivated during lower power times.

In some examples, if the power usage by the CPU 202 and the TEC 230 is above a certain threshold, the liquid cooling system 200 may switch back to the first mode, which may be more efficient for cooling. For example, assume the CPU 202 is operating at a high processing demand and is producing about 200 W of heat. In such an instances, the TEC 230 may be operating at a high power state and also generating about 200 W of heat. All of this heat (400 W of heat) is transferred to the first thermal block 226 and needs to be cooled by the cooling liquid. The liquid cooling system 200 may not be able to efficiently cool the cooling liquid (even with the fan 216 running at full speed). Therefore, at this point, it is more efficient to switch to the first mode and cool the second thermal block 228 directly with the cooling liquid (i.e., only cooling 200 W of heat from the CPU 202 rather than 400 W of heat from both the CPU 202 and the TEC 230). Therefore, in some examples the controller 224 may monitor for a certain threshold power usage or heat output and switch back to the first mode.

As shown in FIG. 2, the example controller 224 includes pump control circuitry 248, fan control circuitry 250, TEC control circuitry 252, valve control circuitry 254, a sensor interface 256, and comparator circuitry 258. The pump control circuitry 248 controls the operations of the pump 212, such as activating or deactivating the pump 212 and/or changing the speed of the pump 212 (e.g., to increase or decrease the flow rate of the cooling liquid). The fan control circuitry 250 controls the operations of the fan 216, such as activating or deactivating the fan 216 and/or changing the speed of the fan 216. The TEC control circuitry 252 controls the operations of the TEC 230. For example, the TEC control circuitry 252 can activate the TEC 230 by applying a voltage to the TEC 230 or deactivate the TEC 230 by ceasing the supply of voltage to the TEC 230. In some examples, the TEC control circuitry 252 can also increase or decrease the heat flux of the TEC 230 by increasing or decreasing the voltage applied to the TEC 230. The valve control circuitry 254 controls the operations of the valve 222. For example, the valve control circuitry 254 can control the valve 222 to move between the closed position and the one or more open positions.

The sensor interface 256 receives data indicative of one or more parameters or parameter values being monitored. For example, the sensor interface 256 may receive a signal (e.g., a period interval) from the CPU 202 indicating the power usage of the CPU 202. The comparator circuitry 258 compares the parameter or parameter value (e.g., the power usage) to a threshold. If the parameter or parameter value meets (e.g., exceeds) the threshold, the controller 224 controls the components to switch between the first and second modes. For example, if the power usage exceeds a power usage threshold, the controller 224 may control the components to switch the liquid cooling system 200 from the first mode to the second mode. Additionally or alternatively, the controller 224 may monitor one or more other types of parameters. For example, the sensor interface 256 may receive temperature measurements from a temperature sensor 260. The temperature sensor 260 may be disposed on or near the CPU 202. The comparator circuitry 258 may compare the temperature to a temperature threshold. The controller 224 may switch between the first and second modes based on the comparison. Additionally or alternatively, the sensor interface 256 can receive temperature measurements from other locations, such as at the first thermal block 226 and at the second thermal block 228. Therefore, the controller 224 actively monitors one or more parameters and switches between the first and second modes to ensure the CPU 202 is properly and efficiently cooled.

FIG. 3 is an exploded view an example physical implementation of the example cooler 210. As disclosed above, the cooler 210 includes the first thermal block 226, the second thermal block 228, and the TEC 230. When the cooler 210 is assembled, the TEC 230 is disposed between (e.g., clamped between) the first and second thermal blocks 226, 228. The TEC 230 has the hot side 244 and the cold side 246 opposite the hot side 244. In this example, the TEC 230 is cuboid shaped. In other examples, the TEC 230 can be shaped differently. In the illustrated example, two wires 300, 302 extend from the TEC 230. The wires 300, 302 are electrically coupled to the controller 224 (FIG. 2), which controls the voltage applied to the TEC 230.

The first thermal block 226 has the first side 232 and the second side 234 opposite the first side 232. In the illustrated example, the first thermal block 226 has a first edge 304, a second edge 306 opposite the first edge 304, a third edge 308, and a fourth edge 310 opposite the third edge 308. In this example, the first thermal block 226 is generally cuboid shaped. In other examples, the first thermal block 226 can be shaped differently. In the illustrate example, the first thermal block 226 has an inlet opening 312 and an outlet opening 314 for the first fluid passageway 240 (FIG. 2) that extends through the first thermal block 226. The first fluid passageway 240 can be designed to make any sort of path through the first thermal block 226. The fluid circuit 220 (FIG. 1) can be coupled to the inlet and outlet openings 312, 314. In this example the inlet and outlet openings 312, 314 are on the first edge 304. In other examples, the inlet opening 312 and/or the outlet opening 314 can be on another side or edge of the first thermal block 226.

The second thermal block 228 has the first side 236 and the second side 238 opposite the first side 236. In the illustrated example, the second thermal block 228 has a first edge 316, a second edge 318 opposite the first edge 316, a third edge 320, and a fourth edge 322 opposite the third edge 320. Therefore, in this example, the second thermal block 228 is generally cuboid shaped. In other examples, the second thermal block 228 can be shaped differently.

In this example, the cooler 210 includes threaded fasteners 324 (e.g., bolts) (one of which is referenced in FIG. 3) to couple the first and second thermal blocks 226, 228. In the illustrated example, the first thermal block 226 has openings 326 (one of which is referenced in FIG. 3) at each of its corners. Similarly, the second thermal block 228 has openings 328 (one of which is reference in FIG. 3) at each of its corners. When the cooler 210 is assembled, the openings 326, 328 are aligned, and the threaded fasteners 324 can be inserted into (e.g., screwed into) the openings 326, 328 to couple the first and second thermal blocks 226, 228. In some examples, the openings 326, 328 are threaded. In other examples, the openings 326, 328 are not threaded, and instead are formed as through-holes. In such an example, a nut may be coupled to an end of each of the threaded fasteners 324. In some examples, the threaded fasteners 324 extend through openings in the CPU 202 (FIG. 2) (e.g., in the substrate 204) and into the openings 326, 328 to couple the cooler 210 to the CPU 202. In other examples, the first and second thermal blocks 226, 228 can be coupled via other mechanical and/or chemical fastening techniques.

As disclosed above, the second thermal block 228 has the second fluid passageway 242 (FIG. 2). In the illustrated example, the cooler 210 includes a hose connector 330 that forms an inlet opening 332 and an outlet opening 334. The inlet opening 332 and the outlet opening 334 are fluidly coupled to the second fluid passageway 242 in the second thermal block 228. The fluid circuit 220 (FIG. 1) can be coupled to the inlet and outlet openings 332, 334. In the illustrated example, the hose connector 330 with the inlet and outlet openings 332, 334 is on the first side 236 of the second thermal block 228 near the fourth edge 322. In other examples, the inlet and outlet openings 332, 334 can be provided on another side or edge of the second thermal block 228.

When the cooler 210 is assembled, the TEC 230 is disposed on the first side 236 of the second thermal block 228. In particular, the TEC 230 is disposed on a central region 336 (shown in dashed lines) of the second thermal block 228 on the first side 236. The second fluid passageway 242 (FIG. 2) is disposed outside of the central region 336 and therefore is not disposed directly between the TEC 230 and the second side 238 of the second thermal block 228. This enables the TEC 230 to better cool the material of the second thermal block 228 directly between the TEC 230 and the CPU 202 (FIG. 2) and, thereby more efficiently cool the CPU 202.

Figure 4A:
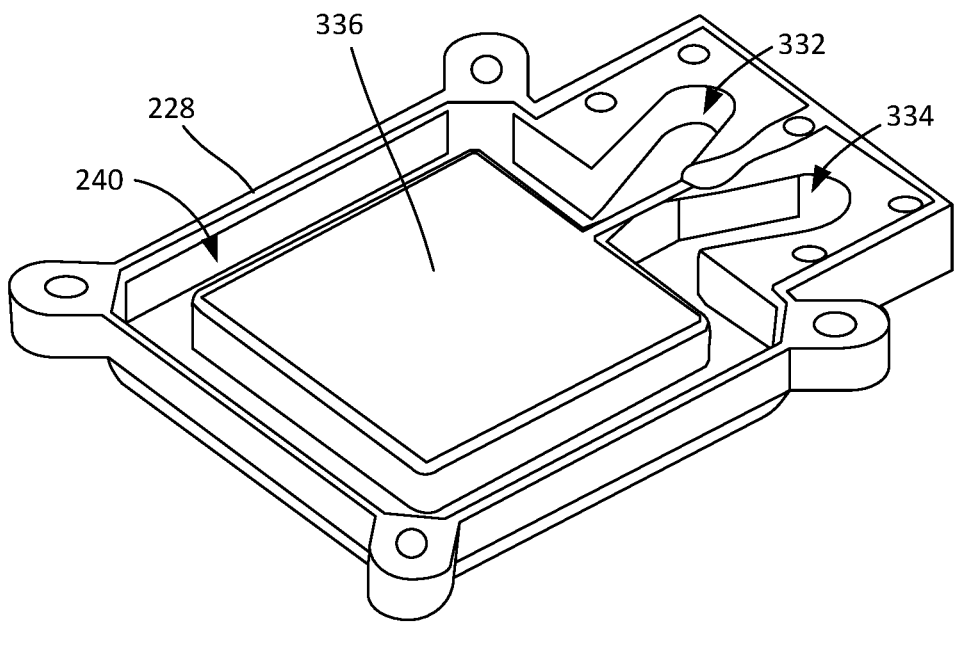
FIG. 4A shows an example thermal block of the example cooler of FIG. 2 with a top side removed to expose an internal fluid passageway.
Figure 4B:
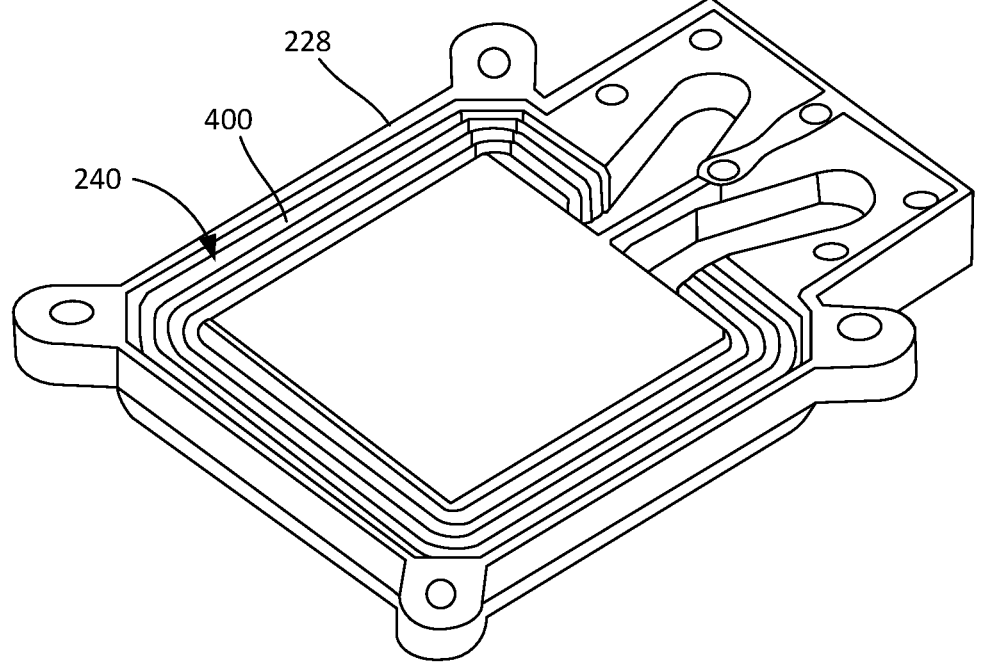
FIG. 4B shows the example thermal block of FIG. 4A with example fins.

For example, FIG. 4A shows the second thermal block 228 with the first side 236 (FIG. 3) removed to expose the second fluid passageway 242 formed in the second thermal block 228. In this example, the second fluid passageway 242 forms a U or C-shaped pathway through the second thermal block 228 between the inlet opening 332 and the outlet opening 334. The second fluid passageway 242 is disposed outside of (e.g., surrounds) the central region 336, but does extend through the central region 336. The central region 336 may be solid material (e.g., thermally conductive material such as metal). As such, none of the second fluid passageway 242 is disposed directly between the TEC 230 (FIGS. 2 and 3) and the CPU 202 (FIG. 2) when the cooler 210 is assembled and coupled to the CPU 202.

In some examples, one or more fins or walls can be provided in the second fluid passageway 242. For example, FIG. 4A shows an example in which the second thermal block 228 includes a plurality of fins 400 (one of which is referenced in FIG. 4A) disposed in the second fluid passageway 242. The fins 400 separate the second fluid passageway 242 into multiple parallel fluid passageways. The fins 400 increase the contact area between the cooling liquid and the second thermal block 228, which improves heat transfer (absorption) to the cooling liquid flowing through the second fluid passageway 242. The second thermal block 228 may include any number of fins.

Figure 5:
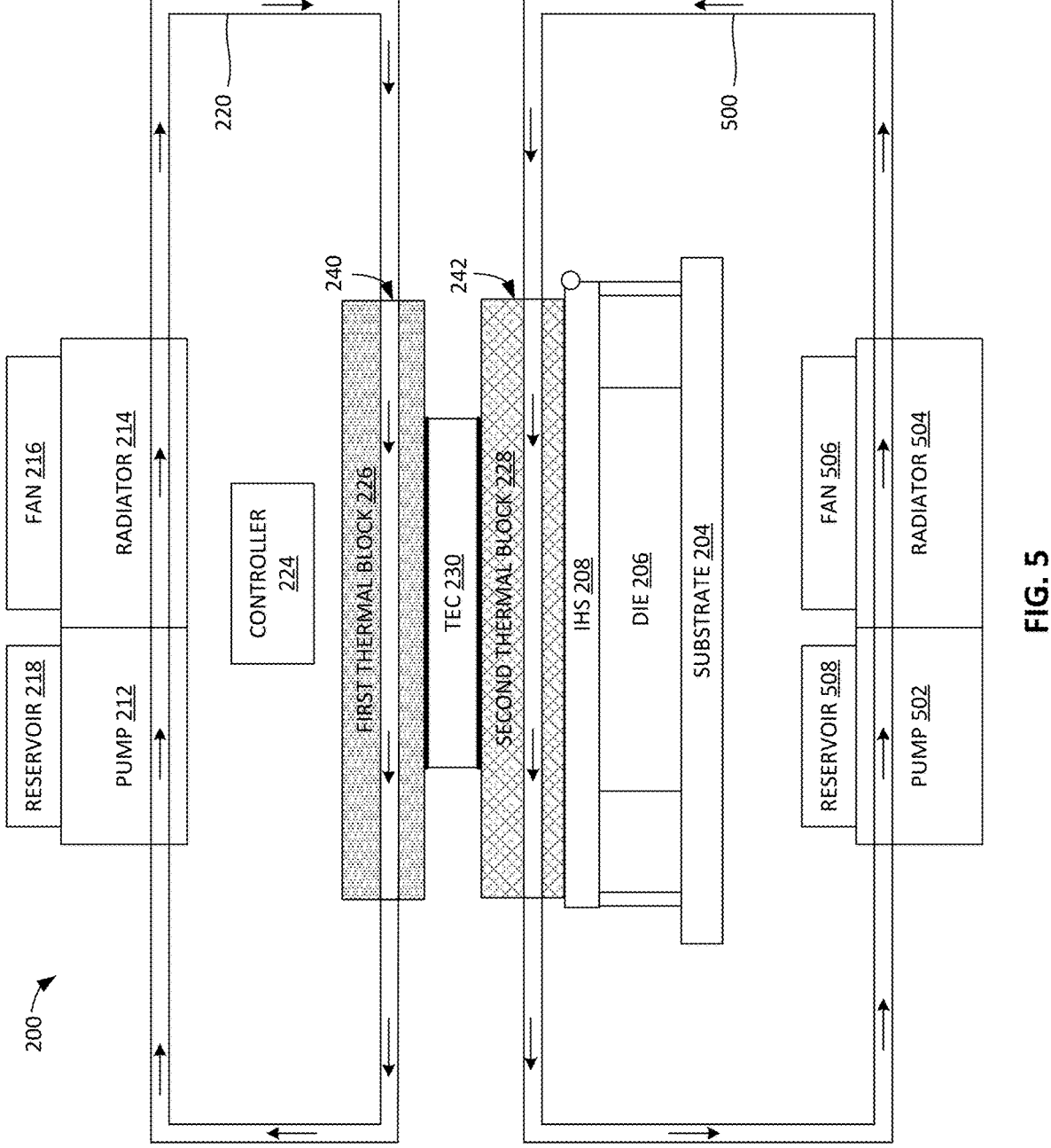
FIG. 5 is another schematic diagram of an example liquid cooling system including separate fluid circuits.

While in the illustrated example of FIG. 2 the liquid cooling system 200 utilizes one fluid circuit 220 that is switched (e.g., via the valve 222) between the first and second thermal blocks 226, 228, in other examples, a separate fluid circuit could be included for the second thermal block 228. For example, FIG. 5 shows a schematic in which the liquid cooling system 200 includes a second fluid circuit 500 that fluidly couples the second fluid passageway 242 of the second thermal block 228 to a second pump 502 and a radiator 504. The example liquid cooling system 200 can include a second fan 506 and a second reservoir 508. The controller 224 can similarly control the second pump 502 and the second fan 506. In this example, the first fluid circuit 220 is separate (fluidly isolated) from the second fluid circuit 500. In this example, instead of operating a valve to control the flow of cooling fluid through the first and second fluid passageways 240, 242, the controller 224 can activate or deactivate the first pump 212 or the second pump 502. For example, in the first mode, the controller 224 activates the second pump 502 to pump cooling liquid through the second thermal block 228, and deactivates the first pump 212. In the second mode, the controller 224 activates the first pump 212 to pump cooling liquid through the first thermal block 226 while the TEC 230, and deactivates the second pump 502.

While an example manner of implementing the controller 224 is illustrated in FIG. 2, one or more of the elements, processes, and/or devices illustrated in FIG. 2 may be combined, divided, re-arranged, omitted, eliminated, and/or implemented in any other way. Further, the example pump control circuitry 248, the example fan control circuitry 250, the example TEC control circuitry 252, the example valve control circuitry 254, the example sensor interface 256, the example comparator circuitry 258, and/or, more generally, the example controller 224 of FIG. 2, may be implemented by hardware alone or by hardware in combination with software and/or firmware. Thus, for example, any of the example pump control circuitry 248, the example fan control circuitry 250, the example TEC control circuitry 252, the example valve control circuitry 254, the example sensor interface 256, the example comparator circuitry 258, and/or, more generally, the example controller 224, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). Further still, the example controller 224 of FIG. 2 may include one or more elements, processes, and/or devices in addition to, or instead of, those illustrated in FIG. 2, and/or may include more than one of any or all of the illustrated elements, processes and devices.

A flowchart representative of example hardware logic circuitry, machine readable instructions, hardware implemented state machines, and/or any combination thereof for implementing the controller 224 of FIG. 2 is shown in FIG. 6. The machine readable instructions may be one or more executable programs or portion(s) of an executable program for execution by processor circuitry, such as the processor circuitry 712 shown in the example processor platform 700 discussed below in connection with FIG. 7 and/or the example processor circuitry discussed below in connection with FIGS. 8 and/or 9. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowchart illustrated in FIG. 6, many other methods of implementing the example controller 224 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIG. 6 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium are expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 6 is a flowchart representative of example machine readable instructions and/or example operations 600 that may be executed and/or instantiated by processor circuitry to control operation of the liquid cool system 200. In particular, the machine readable instructions and/or operations 600, when executed, cause the processor circuitry to at least perform the associated operation(s). The machine readable instructions and/or the operations 600 of FIG. 6 begin at block 602, at which the controller 224 operates the liquid cooling system 200 in the first mode. The first mode may be implemented, for example, during periods of lower processing demands by the CPU 202. In the first mode, the TEC 230 is deactivated and the valve 222 is in a first position that directs the cooling liquid (or enables the cooling liquid to flow) to the second (bottom) thermal block 228 of the cooler 210. For example, in the first mode, the TEC control circuitry 252 deactivates the TEC 230 (if the TEC 230 was previously activated) or continues to apply no voltage to the TEC 230. Further, the valve control circuitry 254 controls the valve 222 to a first position (or maintains the current position) that directs or enables the cooling liquid to flow to and through the second fluid passageway 242 of the second thermal block 228. In other words, the valve 222 fluidly couples the pump 212 and the second thermal block 228. In some examples, in the first position, the valve 222 also directs or enables the cooling liquid to flow to/through the first fluid passageway 240 of the first (top) thermal block 226. However, in other examples, in the first position, the valve 222 enables the cooling liquid to flow to the second thermal block 228 but not the first thermal block 226 during the first mode. In the first mode, the pump control circuitry 248 controls the pump 212 to pump the cooling liquid through the fluid circuit 220. In some examples, the pump control circuitry 248 can increase or decrease the speed of the pump 212 to maintain a target or desired temperature at the CPU 202. The fan control circuitry 250 controls the fan 216. The fan control circuitry 250 can activate or deactivate the fan 216 and/or increase or decrease the speed of the fan 216.

At block 604, the sensor interface 256 measures a parameter value while the liquid cooling system 200 is in the second mode. In this example, the parameter value is the power usage of the CPU 202. For example, the sensor interface 256 may receive a periodic measurement (e.g., every second, 10 seconds, 30 seconds, one minute, etc.) of the power usage from the CPU 202. In other examples, one or more other parameters may be monitored in addition to or as an alternative to the power usage.

At block 606, the comparator circuitry 258 determines whether the parameter value meets a threshold. In some examples, the comparator circuitry 258 compares the parameter value to a threshold. For example, the the comparator circuitry 258 can compare the power usage of the CPU 202 to a power usage threshold. The power usage threshold may be any threshold amount based on the capabilities of the CPU 202. For example, the threshold power usage threshold may be 200 Watts. If the parameter value does not meet the threshold (e.g., the power usage of the CPU 202 does not exceed the power usage threshold), control proceeds back to block 604 and the sensor interface 256 continues to monitor the parameter value. This cycle may be repeated periodically or at a certain frequency, such as every second, every 10 seconds, every 30 seconds, every minute, etc.

If the comparator circuitry 258 determines the parameter value meets the threshold (e.g., the power usage of the CPU 202 exceeds the power usage threshold), the controller 224, at block 608, performs one or more actions switch the liquid cooling system 200 to operate in the second mode. In other words, in response to determining the parameter value meets the threshold, the controller 224 operates the liquid cooling system 200 in the second mode. This may occur, for example, during times of higher processing demands of the CPU 202, such as when running multiple applications simultaneously, gaming, rendering a high graphic video, etc. In the second mode, the TEC 230 is activated and the valve 222 is controlled to a second position that directs the cooling liquid (or enables the cooling liquid to flow) to the first (top) thermal block 226 but not the second (bottom) thermal block 228. For example, the TEC control circuitry 252 activates the TEC 230 by applying a voltage the TEC 230. The voltage may be based on the desired cooling temperature. Further, the valve control circuitry 254 controls the valve 222 to a second position that directs or enables the cooling liquid to flow to and through the first fluid passageway 240 of the first thermal block 226. In other words, the valve 222 fluidly couples the pump 212 and the first thermal block 226. However, in the second mode, the second position of the valve 222 does not allow the cooling liquid to be pumped to or through the second fluid passageway 242 of the second thermal block 228. This prevents or reduces the ability of the cooling liquid from interfering with the sub-ambient temperatures generated by the TEC 230. While in the second mode, the pump control circuitry 248 can increase or decrease the speed of the pump 212 and/or the fan control circuitry 250 can increase or decrease the speed of the fan 216.

At block 610, the sensor interface 256 continues to measure (e.g., monitor) the parameter value. For example, the sensor interface 256 continues to receive power usage measurements from the CPU 202. At block 612, the comparator circuitry 258 determines whether the parameter value still meets the threshold. For example, the comparator circuitry 258 compares the parameter value to the threshold. If the parameter value still meets threshold (e.g., the power usage of the CPU 202 still exceeds the power usage threshold), control proceeds back to block 610 and the sensor interface 256 continues to monitor the parameter value. For example, if the power usage of the CPU 202 is still above the power usage threshold (e.g., 200 W), the liquid cooling system 200 continues to operate in the second mode so that the TEC 230 can provide sub-ambient cooling to the CPU 202. However, if the parameter value does not meet the threshold (e.g., the power usage of the CPU 202 drops below the power usage threshold), control proceeds to block 602, and the controller 224 performs one or more actions to operate or switch the liquid cooling system 200 to the first mode. In other words, in response to determining the parameter value does not meet the threshold, the controller 224 operates the liquid cooling system 200 in the first mode. The controller 224 may repeatedly switch the liquid cooling system 200 back-and-forth between the first and second modes based on the parameter value (e.g., the power usage of the CPU 202). In some examples, the example process 600 may end when the liquid cooling system 200 is deactivated and/or when the electronic device 100 is deactivated (e.g., the computer is turned off).

In some examples, only one parameter or parameter value is monitored. In other examples, multiple parameters or parameter values are monitored. For example, the controller 224 may monitor the temperature inside of the electronic device 100 (e.g., via the temperature sensor 260), the humidity inside of the electronic device 100, etc. The comparator circuitry 258 may compare each of the parameters or parameter values to a corresponding threshold. In some examples, if one of the parameters meets (e.g., exceeds) its corresponding threshold, the controller 224 switches the liquid cooling system 200 between the first and second modes. In other examples, two or more the parameters or parameter values must meet their respective thresholds before switching between the first and second modes. For example, the temperature in the electronic device 100 must be above a threshold temperature and the power usage must be above a power usage threshold before switching from the first mode to the second mode.

Figure 7:
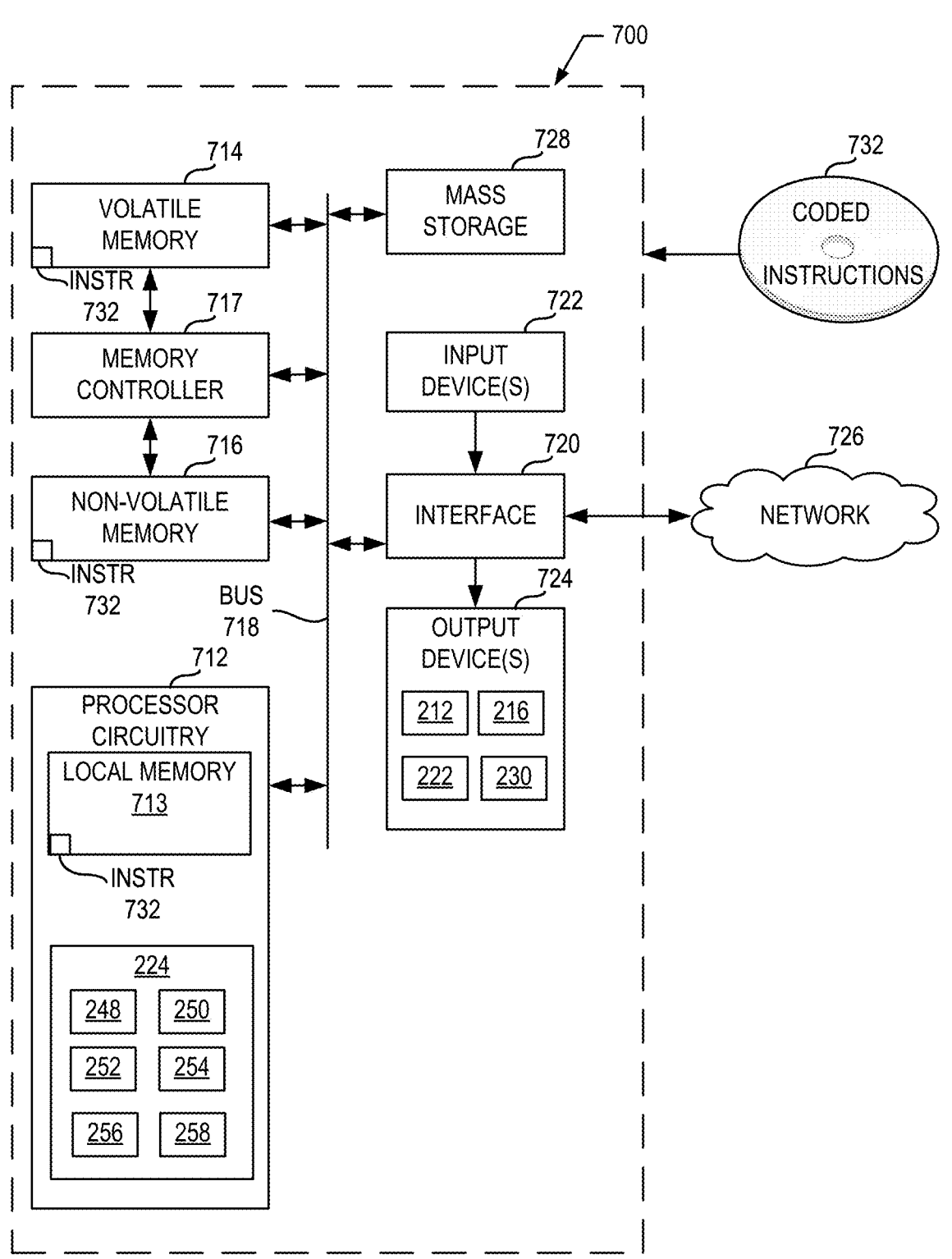
FIG. 7 is a block diagram of an example processing platform including processor circuitry structured to execute the example machine readable instructions and/or the example operations of FIG. 6 to implement the example controller of FIG. 2.

FIG. 7 is a block diagram of an example processor platform 700 structured to execute and/or instantiate the machine readable instructions and/or the operations 600 of FIG. 6 to implement the controller 224 of FIG. 2. The processor platform 700 can be, for example, a server, a personal computer (e.g., the electronic device 100 of FIG. 1), a workstation, a self-learning machine (e.g., a neural network), a mobile device (e.g., a cell phone, a smart phone, a tablet such as an iPad'), a personal digital assistant (PDA), an Internet appliance, a DVD player, a CD player, a digital video recorder, a Blu-ray player, a gaming console, a set top box, or any other type of computing device.

The processor platform 700 of the illustrated example includes processor circuitry 712. The processor circuitry 712 of the illustrated example is hardware. For example, the processor circuitry 712 can be implemented by one or more integrated circuits, logic circuits, FPGAs, microprocessors, CPUs, GPUs, DSPs, and/or microcontrollers from any desired family or manufacturer. The processor circuitry 712 may be implemented by one or more semiconductor based (e.g., silicon based) devices. In this example, the processor circuitry 712 implements the example controller 224 including the example pump control circuitry 248, the example fan control circuitry 250, the example TEC control circuitry 252, the example valve control circuitry 254, the example sensor interface 256, and the example comparator circuitry 258. In some examples, the processor circuitry 712 can be implemented by the CPU 202.

The processor circuitry 712 of the illustrated example includes a local memory 713 (e.g., a cache, registers, etc.). The processor circuitry 712 of the illustrated example is in communication with a main memory including a volatile memory 714 and a non-volatile memory 716 by a bus 718. The volatile memory 714 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 716 may be implemented by flash memory and/or any other desired type of memory device. Access to the main memory 714, 716 of the illustrated example is controlled by a memory controller 717.

The processor platform 700 of the illustrated example also includes interface circuitry 720. The interface circuitry 720 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 722 are connected to the interface circuitry 720. The input device(s) 722 permit(s) a user to enter data and/or commands into the processor circuitry 712. The input device(s) 422 can be implemented by, for example, an audio sensor, a microphone, a camera (still or video), a keyboard, a button, a mouse, a touchscreen, a track-pad, a trackball, an isopoint device, and/or a voice recognition system.

One or more output devices 724 are also connected to the interface circuitry 720 of the illustrated example. The output device(s) 724 can be implemented, for example, by the pump 212, the fan 216, the valve 222, and the TEC 230. Additionally or alternatively, the output device(s) 724 can be implemented by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 720 of the illustrated example, thus, typically includes a graphics driver card, a graphics driver chip, and/or graphics processor circuitry such as a GPU.

The interface circuitry 720 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 726. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 700 of the illustrated example also includes one or more mass storage devices 728 to store software and/or data. Examples of such mass storage devices 728 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine executable instructions 732, which may be implemented by the machine readable instructions of FIG. 6 may be stored in the mass storage device 728, in the volatile memory 714, in the non-volatile memory 716, and/or on a removable non-transitory computer readable storage medium such as a CD or DVD.

Figure 8:
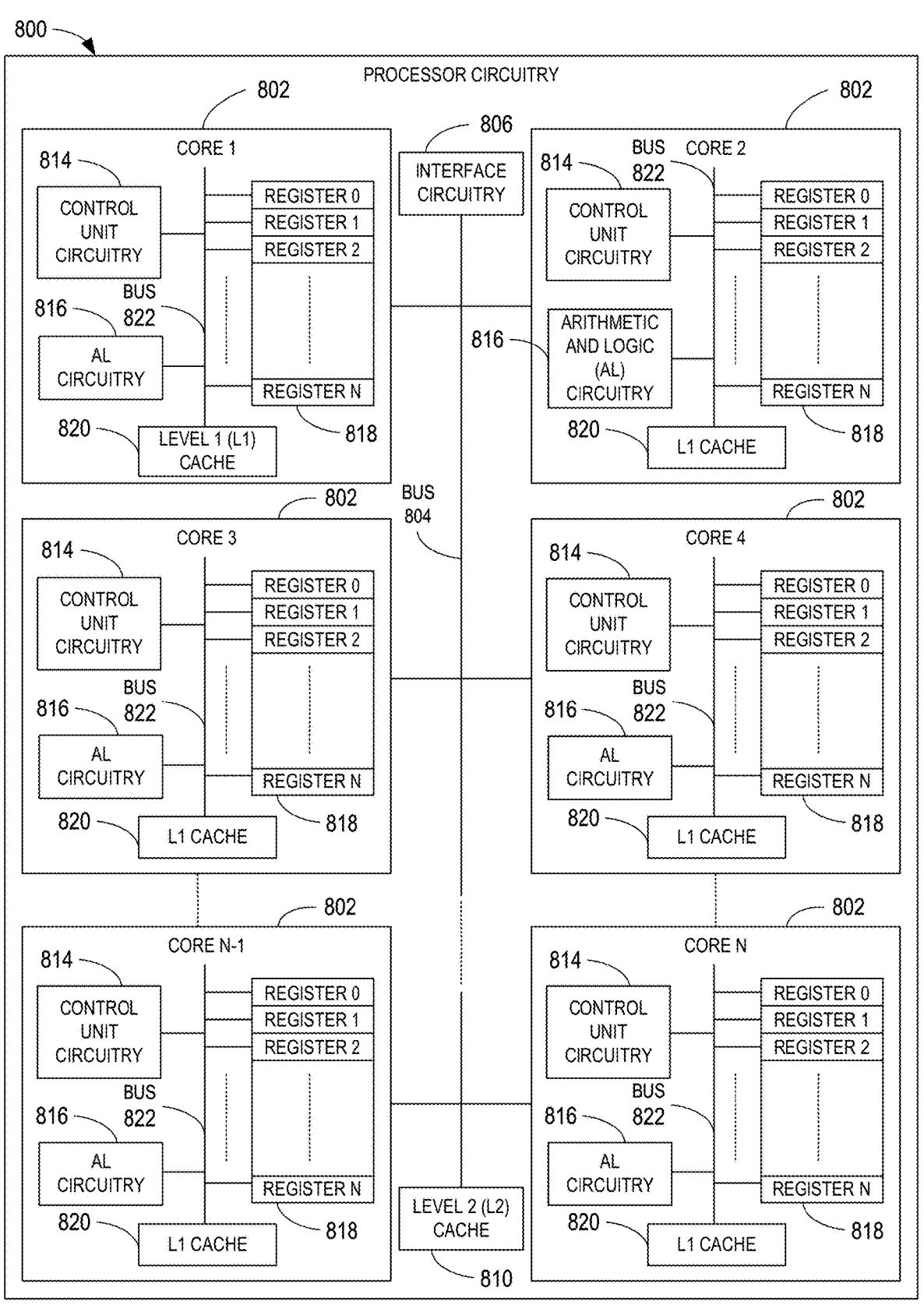
FIG. 8 is a block diagram of an example implementation of the processor circuitry of FIG. 7.

FIG. 8 is a block diagram of an example implementation of the processor circuitry 712 of FIG. 7. In this example, the processor circuitry 712 of FIG. 7 is implemented by a general purpose microprocessor 800. The general purpose microprocessor circuitry 800 executes some or all of the machine readable instructions of the flowchart of FIG. 6 to effectively instantiate the circuitry of FIG. 2 as logic circuits to perform the operations corresponding to those machine readable instructions. In some such examples, the circuitry of FIG. 2 is instantiated by the hardcore circuits of the microprocessor 800 in combination with the instructions. For example, the microprocessor 800 may implement multi-core hardware circuitry such as a CPU, a DSP, a GPU, an XPU, etc. Although it may include any number of example cores 802 (e.g., 1 core), the microprocessor 800 of this example is a multi-core semiconductor device including N cores. The cores 802 of the microprocessor 800 may operate independently or may cooperate to execute machine readable instructions. For example, machine code corresponding to a firmware program, an embedded software program, or a software program may be executed by one of the cores 802 or may be executed by multiple ones of the cores 802 at the same or different times. In some examples, the machine code corresponding to the firmware program, the embedded software program, or the software program is split into threads and executed in parallel by two or more of the cores 802. The software program may correspond to a portion or all of the machine readable instructions and/or operations represented by the flowchart of FIG. 6.

The cores 802 may communicate by a first example bus 804. In some examples, the first bus 804 may implement a communication bus to effectuate communication associated with one(s) of the cores 802. For example, the first bus 804 may implement at least one of an Inter-Integrated Circuit (I2C) bus, a Serial Peripheral Interface (SPI) bus, a PCI bus, or a PCIe bus. Additionally or alternatively, the first bus 804 may implement any other type of computing or electrical bus. The cores 802 may obtain data, instructions, and/or signals from one or more external devices by example interface circuitry 806. The cores 802 may output data, instructions, and/or signals to the one or more external devices by the interface circuitry 806. Although the cores 802 of this example include example local memory 820 (e.g., Level 1 (L1) cache that may be split into an L1 data cache and an L1 instruction cache), the microprocessor 800 also includes example shared memory 810 that may be shared by the cores (e.g., Level 2 (L2_cache)) for high-speed access to data and/or instructions. Data and/or instructions may be transferred (e.g., shared) by writing to and/or reading from the shared memory 810. The local memory 820 of each of the cores 802 and the shared memory 810 may be part of a hierarchy of storage devices including multiple levels of cache memory and the main memory (e.g., the main memory

714, 716 of FIG. 7). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 802 may be referred to as a CPU, DSP, GPU, etc., or any other type of hardware circuitry. Each core 802 includes control unit circuitry 814, arithmetic and logic (AL) circuitry (sometimes referred to as an ALU) 816, a plurality of registers 818, the L1 cache 820, and a second example bus 822. Other structures may be present. For example, each core 802 may include vector unit circuitry, single instruction multiple data (SIMD) unit circuitry, load/store unit (LSU) circuitry, branch/jump unit circuitry, floating-point unit (FPU) circuitry, etc. The control unit circuitry 814 includes semiconductor-based circuits structured to control (e.g., coordinate) data movement within the corresponding core 802. The AL circuitry 816 includes semiconductor-based circuits structured to perform one or more mathematic and/or logic operations on the data within the corresponding core 802. The AL circuitry 816 of some examples performs integer based operations. In other examples, the AL circuitry 816 also performs floating point operations. In yet other examples, the AL circuitry 816 may include first AL circuitry that performs integer based operations and second AL circuitry that performs floating point operations. In some examples, the AL circuitry 816 may be referred to as an Arithmetic Logic Unit (ALU). The registers 818 are semiconductor-based structures to store data and/or instructions such as results of one or more of the operations performed by the AL circuitry 816 of the corresponding core 802. For example, the registers 818 may include vector register(s), SIMD register(s), general purpose register(s), flag register(s), segment register(s), machine specific register(s), instruction pointer register(s), control register(s), debug register(s), memory management register(s), machine check register(s), etc. The registers 818 may be arranged in a bank as shown in FIG. 8. Alternatively, the registers 818 may be organized in any other arrangement, format, or structure including distributed throughout the core 802 to shorten access time. The second bus 822 may implement at least one of an I2C bus, a SPI bus, a PCI bus, or a PCIe bus Each core 802 and/or, more generally, the microprocessor 800 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 800 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 9:
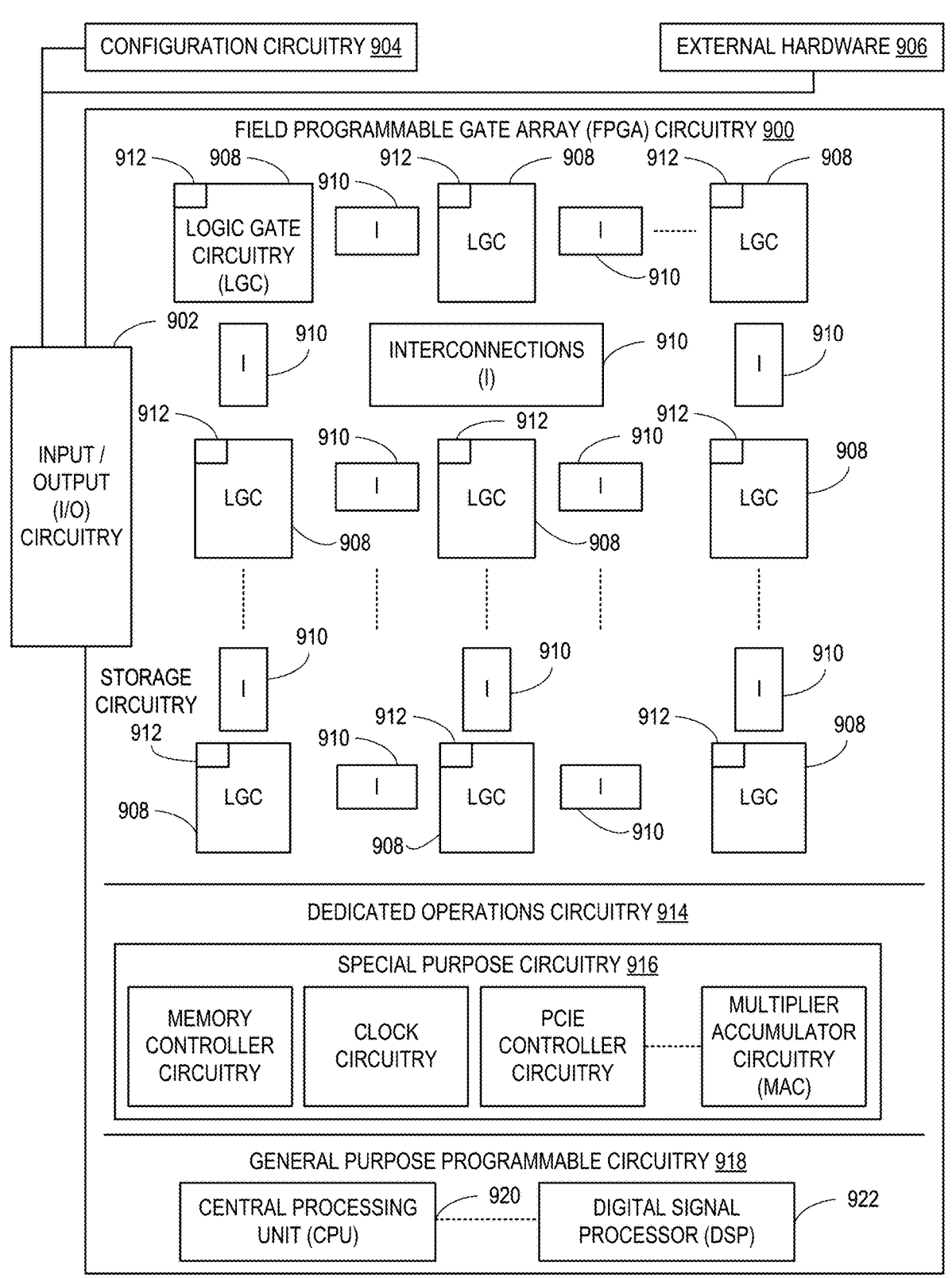
FIG. 9 is a block diagram of another example implementation of the processor circuitry of FIG. 7.

FIG. 9 is a block diagram of another example implementation of the processor circuitry 712 of FIG. 7. In this example, the processor circuitry 712 is implemented by FPGA circuitry 900. The FPGA circuitry 900 can be used, for example, to perform operations that could otherwise be performed by the example microprocessor 800 of FIG. 8 executing corresponding machine readable instructions. However, once configured, the FPGA circuitry 900 instantiates the machine readable instructions in hardware and, thus, can often execute the operations faster than they could be performed by a general purpose microprocessor executing the corresponding software.

More specifically, in contrast to the microprocessor 800 of FIG. 8 described above (which is a general purpose device that may be programmed to execute some or all of the machine readable instructions represented by the flowchart of FIG. 6 but whose interconnections and logic circuitry are fixed once fabricated), the FPGA circuitry 900 of the example of FIG. 9 includes interconnections and logic circuitry that may be configured and/or interconnected in different ways after fabrication to instantiate, for example, some or all of the machine readable instructions represented by the flowchart of FIG. 6. In particular, the FPGA 900 may be thought of as an array of logic gates, interconnections, and switches. The switches can be programmed to change how the logic gates are interconnected by the interconnections, effectively forming one or more dedicated logic circuits (unless and until the FPGA circuitry 900 is reprogrammed). The configured logic circuits enable the logic gates to cooperate in different ways to perform different operations on data received by input circuitry. Those operations may correspond to some or all of the software represented by the flowchart of FIG. 6. As such, the FPGA circuitry 900 may be structured to effectively instantiate some or all of the machine readable instructions of the flowchart of FIG. 6 as dedicated logic circuits to perform the operations corresponding to those software instructions in a dedicated manner analogous to an ASIC. Therefore, the FPGA circuitry 900 may perform the operations corresponding to the some or all of the machine readable instructions of FIG. 6 faster than the general purpose microprocessor can execute the same.

In the example of FIG. 9, the FPGA circuitry 900 is structured to be programmed (and/or reprogrammed one or more times) by an end user by a hardware description language (HDL) such as Verilog. The FPGA circuitry 900 of FIG. 9, includes example input/output (I/O) circuitry 902 to obtain and/or output data to/from example configuration circuitry 904 and/or external hardware (e.g., external hardware circuitry) 906. For example, the configuration circuitry 904 may implement interface circuitry that may obtain machine readable instructions to configure the FPGA circuitry 900, or portion(s) thereof. In some such examples, the configuration circuitry 904 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 906 may implement the microprocessor 800 of FIG. 8. The FPGA circuitry 900 also includes an array of example logic gate circuitry 908, a plurality of example configurable interconnections 910, and example storage circuitry 912. The logic gate circuitry 908 and interconnections 910 are configurable to instantiate one or more operations that may correspond to at least some of the machine readable instructions of FIG. 6 and/or other desired operations. The logic gate circuitry 908 shown in FIG. 9 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 908 to enable configuration of the electrical structures and/or the logic gates to form circuits to perform desired operations. The logic gate circuitry 908 may include other electrical structures such as look-up tables (LUTs), registers (e.g., flip-flops or latches), multiplexers, etc.

The interconnections 910 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 908 to program desired logic circuits.

The storage circuitry 912 of the illustrated example is structured to store result(s) of the one or more of the operations performed by corresponding logic gates. The storage circuitry 912 may be implemented by registers or the like. In the illustrated example, the storage circuitry 912 is distributed amongst the logic gate circuitry 908 to facilitate access and increase execution speed.

The example FPGA circuitry 900 of FIG. 9 also includes example Dedicated Operations Circuitry 914. In this example, the Dedicated Operations Circuitry 914 includes special purpose circuitry 916 that may be invoked to implement commonly used functions to avoid the need to program those functions in the field. Examples of such special purpose circuitry 916 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 900 may also include example general purpose programmable circuitry 918 such as an example CPU 920 and/or an example DSP 922. Other general purpose programmable circuitry 918 may additionally or alternatively be present such as a GPU, an XPU, etc., that can be programmed to perform other operations.

Although FIGS. 8 and 9 illustrate two example implementations of the processor circuitry 712 of FIG. 7, many other approaches are contemplated. For example, as mentioned above, modern FPGA circuitry may include an onboard CPU, such as one or more of the example CPU 920 of FIG. 9. Therefore, the processor circuitry 712 of FIG. 7 may additionally be implemented by combining the example microprocessor 800 of FIG. 8 and the example FPGA circuitry 900 of FIG. 9. In some such hybrid examples, a first portion of the machine readable instructions represented by the flowchart of FIG. 6 may be executed by one or more of the cores 802 of FIG. 8, a second portion of the machine readable instructions represented by the flowchart of FIG. 6 may be executed by the FPGA circuitry 900 of FIG. 9, and/or a third portion of the machine readable instructions represented by the flowchart of FIG. 6 may be executed by an ASIC. It should be understood that some or all of the circuitry of FIG. 2 may, thus, be instantiated at the same or different times. Some or all of the circuitry may be instantiated, for example, in one or more threads executing concurrently and/or in series. Moreover, in some examples, some or all of the circuitry of FIG. 2 may be implemented within one or more virtual machines and/or containers executing on the microprocessor.

In some examples, the processor circuitry 712 of FIG. 7 may be in one or more packages. For example, the processor circuitry 700 of FIG. 7 and/or the FPGA circuitry 900 of FIG. 9 may be in one or more packages. In some examples, an XPU may be implemented by the processor circuitry 712 of FIG. 7, which may be in one or more packages. For example, the XPU may include a CPU in one package, a DSP in another package, a GPU in yet another package, and an FPGA in still yet another package.

From the foregoing, it will be appreciated that example systems, methods, apparatus, and articles of manufacture have been disclosed that improve the cooling capability of a liquid cooling system when a thermoelectric cooler (TEC) is not activated. This enables the fan(s) to run less frequently and/or at lower speeds, which reduces the audible noise generated by such fan(s). This also reduces the amount of time the TEC is used, which reduces overall power consumption of the cooling system.

Example systems, methods, apparatus, and articles of manufacture for cooling an electronic device are disclosed herein. Further examples and combinations thereof include the following:

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. A cooler for an electronic device, the cooler comprising:
   a first thermal block having a first fluid passageway;
   a second thermal block having a second fluid passageway, the second thermal block having a first side and a second side opposite the first side; and
   a thermoelectric cooler (TEC) coupled between the first thermal block and the second thermal block, the second side of the second thermal block to be disposed on a processor of the electronic device such that the second thermal block is disposed between the TEC and the processor, the TEC on a central region on the first side of the second thermal block, the second fluid passageway outside of the central region such that the second fluid passageway is not directly between the TEC and the second side of the second thermal block.

2. The cooler of claim 1, wherein the second thermal block includes a plurality of fins in the second fluid passageway.

3. The cooler of claim 1, wherein the second fluid passageway is part of a U or C-shaped pathway through the second thermal block.

4. The cooler of claim 1, wherein the second fluid passageway is in the second thermal block.

5. The cooler of claim 1, wherein the TEC has a hot side and a cold side opposite the hot side, the hot side in contact with the first thermal block, the cold side in contact with the second thermal block.

6. The cooler of claim 1, wherein the second thermal block includes copper.

7. A liquid cooling system for an electronic device, the liquid cooling system comprising:
   a first thermal block having a first fluid passageway, a second thermal block having a second fluid passageway, and a thermoelectric cooler (TEC) between the first and second thermal blocks;
   a fluid circuit coupled to the first and second fluid passageways;
   a valve coupled to the fluid circuit; and

US 12,608,059 B2

23 control circuitry to:

during a first mode, control the valve to a first position to enable cooling liquid in the fluid circuit to flow to the second fluid passageway of the second thermal block but block the cooling liquid from flowing to the first fluid passageway of the first thermal block; and during a second mode, control the valve to a second position to enable the cooling liquid in the fluid circuit to flow to the first fluid passageway of the first thermal block but block the cooling liquid from flowing to the second fluid passageway in the second thermal block.

8. The liquid cooling system of claim 7, wherein the control circuitry is to deactivate the TEC during the first mode and activate the TEC during the second mode.

9. The liquid cooling system of claim 7, wherein the control circuitry is to switch between the first mode and the second mode based on power usage of a central processing unit (CPU).

10. The liquid cooling system of claim 7, wherein the second thermal block has a first side and a second side opposite the first side, the second side of the second thermal block on a central processing unit (CPU) of the electronic device, the TEC on a central region of the second thermal block on the first side, the second fluid passageway disposed outside of the central region such that the second fluid passageway is not directly between the TEC and the second side of the second thermal block.

11. The liquid cooling system of claim 7, including a radiator, the fluid circuit coupled to the radiator to direct the cooling liquid through the radiator.

12. The liquid cooling system of claim 11, including a fan to direct ambient air across the radiator.

13. An electronic device comprising:
a central processing unit (CPU); and
a liquid cooling system to reduce a temperature of the CPU, the liquid cooling system including:
a thermal block having a first side and a second side opposite the first side, the second side on the CPU, the thermal block having a fluid passageway;
a thermoelectric cooler (TEC) on the first side, the thermal block is between the TEC and the CPU; and
a valve;
the CPU to:
during a first mode, deactivate the TEC and control the valve to direct cooling liquid through the fluid passageway of the thermal block; and
during a second mode, activate the TEC and control the valve to cease directing the cooling liquid through the fluid passageway of the thermal block.

14. The electronic device of claim 13, wherein the thermal block has a first side and a second side opposite the first side, the second side of the thermal block on the CPU, the TEC on a central region on the first side of the thermal block, the fluid passageway outside of the central region such that the fluid passageway is not directly between the TEC and the second side of the thermal block.

15. The electronic device of claim 13, wherein the CPU includes an integrated heat spreader, the thermal block of the cooler coupled to the integrated heat spreader.

16. The electronic device of claim 13, wherein the electronic device is a computer.

17. A non-transitory computer readable medium comprising instructions that, when executed, cause processor circuitry to at least:
operate a liquid cooling system of an electronic device in a first mode, the liquid cooling system including a cooler including a first thermal block having a first fluid passageway, a second thermal block having a second fluid passageway, and a thermoelectric cooler (TEC) between the first and second thermal blocks, the second thermal block disposed on or near a central processing unit (CPU) of the electronic device, the liquid cooling system including a fluid circuit coupled to the first and second fluid passageways and a valve coupled to the fluid circuit, wherein the instructions, when executed, cause the processor circuitry to operate the liquid cooling system in the first mode by deactivating the TEC and controlling the valve to a first position to direct cooling liquid to flow to the second fluid passageway of the second thermal block but block the cooling liquid from flowing to the first fluid passageway of the first thermal block;
measure a parameter value; and
in response to determining the parameter value meets a threshold, operate the liquid cooling system in a second mode by activating the TEC and controlling the valve to a second position to direct the cooling liquid to flow to the first fluid passageway of the first thermal block but block the cooling liquid from flowing to the second fluid passageway of the second thermal block.

18. The non-transitory computer readable medium of claim 17, wherein the parameter value is power usage of the CPU of the electronic device.

19. The non-transitory computer readable medium of claim 17, wherein the instructions, when executed, cause the processor circuitry to:
measure the parameter value while the liquid cooling system is in the second mode; and
in response to determining the parameter value does not meet the threshold, operate the liquid cooling system in the first mode.

* * * * *